United States Patent
Lee et al.

(10) Patent No.: US 9,543,543 B2
(45) Date of Patent: Jan. 10, 2017

(54) SUBSTRATE FOR DISPLAY APPARATUS, AND DISPLAY APPARATUS USING THE SAME

(71) Applicant: SAMSUNG DISPLAY CO., LTD., Yongin, Gyeonggi-Do (KR)

(72) Inventors: Jae-Seob Lee, Yongin (KR); Jin-Gyu Kang, Yongin (KR); Yong-Kwan Kim, Yongin (KR); Sang-Ki Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 88 days.

(21) Appl. No.: 14/262,979

(22) Filed: Apr. 28, 2014

(65) Prior Publication Data

US 2014/0319493 A1 Oct. 30, 2014

(30) Foreign Application Priority Data

Apr. 30, 2013 (KR) ........................ 10-2013-0048520

(51) Int. Cl.
| | | |
|---|---|---|
| *H01L 29/04* | (2006.01) | |
| *H01L 51/52* | (2006.01) | |
| *H01L 27/32* | (2006.01) | |
| *H01L 51/00* | (2006.01) | |
| *H01L 29/786* | (2006.01) | |
| *H01L 27/12* | (2006.01) | |

(52) U.S. Cl.
CPC ....... *H01L 51/5253* (2013.01); *H01L 27/1218* (2013.01); *H01L 27/3244* (2013.01); *H01L 29/78603* (2013.01); *H01L 51/0097* (2013.01)

(58) Field of Classification Search
CPC ... H01L 27/32–27/326; H01L 51/50–51/5012; H01L 51/525–51/5287; H01L 2227/32–2227/326; H01L 2251/5323–2251/5361; H01L 2924/12044
See application file for complete search history.

(56) References Cited

U.S. PATENT DOCUMENTS

| | | | |
|---|---|---|---|
| 7,642,701 B2 * | 1/2010 | Kai | ...... H01L 27/3246 313/292 |
| 2004/0151025 A1 * | 8/2004 | Ngo et al. | ............... 365/185.01 |
| 2004/0157382 A1 | 8/2004 | Tsao et al. | |
| 2007/0031674 A1 | 2/2007 | Tolt | |
| 2009/0256154 A1 | 10/2009 | Lee et al. | |
| 2011/0134018 A1 * | 6/2011 | Seo et al. | ........................ 345/76 |
| 2011/0193067 A1 * | 8/2011 | Lee et al. | ........................ 257/40 |

(Continued)

FOREIGN PATENT DOCUMENTS

| | | |
|---|---|---|
| JP | 2012-16854 A | 1/2012 |
| JP | 2005-254541 A | 9/2012 |

(Continued)

OTHER PUBLICATIONS

Extended European Search Report dated Sep. 10, 2014.

*Primary Examiner* — Cuong B Nguyen
(74) *Attorney, Agent, or Firm* — Lee & Morse, P.C.

(57) ABSTRACT

A substrate for a display apparatus includes a barrier layer disposed on a base substrate. The barrier layer includes a silicon oxide layer, and the silicon oxide layer includes a first part and a second part along a thickness direction of the barrier layer. The amount of silicon in the first part is different from the amount of silicon in the second part.

18 Claims, 3 Drawing Sheets

(56) References Cited

U.S. PATENT DOCUMENTS

2011/0297952 A1  12/2011  Lee et al.
2012/0305981 A1  12/2012  Park et al.

FOREIGN PATENT DOCUMENTS

| KR | 10-0683802 B1 | 2/2007 |
| KR | 10-2011-0062382 A | 6/2011 |
| KR | 10-2011-0092542 A | 8/2011 |
| KR | 10-1056431 B1 | 8/2011 |
| KR | 10-2012-0133952 A | 12/2012 |
| WO | WO 2005/051525 A1 | 6/2005 |

\* cited by examiner

SUBSTRATE FOR DISPLAY APPARATUS, AND DISPLAY APPARATUS USING THE SAME

CROSS-REFERENCE TO RELATED APPLICATION

Korean Patent Application No. 10-2013-0048520, filed on Apr. 30, 2013, and entitled, "SUBSTRATE FOR DISPLAY APPARATUS, AND DISPLAY APPARATUS USING THE SAME," is incorporated by reference herein in its entirety.

BACKGROUND

1. Field

One or more embodiments described herein relate to a display apparatus.

2. Description of the Related Art

A variety of advanced display technologies have been used in mobile devices, including digital and video cameras, personal digital assistants, and cellular phones. In order to meet consumer demand, the displays in these devices are often required to be thin and lightweight, and at the same time generate high quality images. However, many displays have been shown to deteriorate over time because of moisture, contamination from foreign substances, and other effects.

SUMMARY

In accordance with one or more embodiments, a substrate for a display apparatus includes a base substrate and a barrier layer disposed on the base substrate, wherein the barrier layer includes a silicon oxide layer and the silicon oxide layer includes a first part and a second part along a thickness direction of the barrier layer, and wherein an amount of silicon in the first part is different from an amount of silicon in the second part. The amount of silicon in the second part may be higher than the amount of silicon in the first part, the barrier layer may include a first barrier layer which includes the first part and a second barrier layer which includes the second part, and a thickness of the second barrier layer of the silicon oxide layer may be less than a thickness of the first barrier layer.

The barrier layer may include a first barrier layer which includes the first part that contains $SiO_2$; and a second barrier layer which includes the second part that contains a greater amount of silicon than $SiO_2$. A plurality of the first and second barrier layers may be alternately stacked on one another. A composition ratio (c/d) of silicon and nitrogen of the second barrier layer ($Si_cO_d$) may be greater than about 0.5 and equal to or less than about 1.0. The base substrate may include a plastic material and may be flexible. The barrier layer may be formed directly on the base substrate.

In accordance with another embodiment, a display apparatus includes a plastic substrate; a barrier layer on the plastic substrate; a thin film transistor on the plastic substrate; and a display device on the plastic substrate and electrically connected to the thin film transistor, wherein the display device includes an organic emission layer and wherein the barrier layer is disposed between the plastic substrate and the thin film transistor, the barrier layer including a silicon oxide layer having a first part and a second part along a thickness direction, the first and second parts having different amounts of silicon.

The barrier layer comprises a layer including the first part having a first amount of silicon and a layer including the second part having a second amount of silicon greater than the first amount of silicon. A composition ratio (c/d) of silicon and nitrogen of the layer having the second amount of silicon may be greater than about 0.5 and equal to or less than about 1.0. A plurality of layers having the first amount of silicon and second amount of silicon may be alternately formed along the thickness direction.

The barrier layer may include a first barrier layer including the first part which includes $Si_aO_b$, and a second barrier layer including the second part which includes $Si_cO_d$, and wherein a/b≠c/d. A plurality of first and second barrier layers may be alternately stacked on one another.

A thickness of the first barrier layer may be different from a thickness of the second barrier layer. The thickness of the first barrier layer may be greater than the thickness of the second barrier layer. The plastic substrate may include polyimide. A thickness of the first barrier layer may be about 1,000 Å to about 10,000 Å. A thickness of the second barrier layer may be about 200 Å to about 5,000 Å. The display device may include a pixel electrode; an intermediate layer on the pixel electrode and including an organic emission layer; and a counter electrode facing the pixel electrode.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
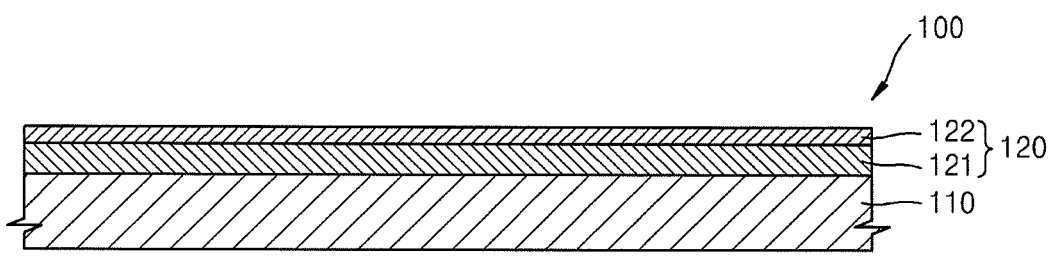
FIGS. 1, 2, and 3 illustrate an embodiment of a substrate for a display apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
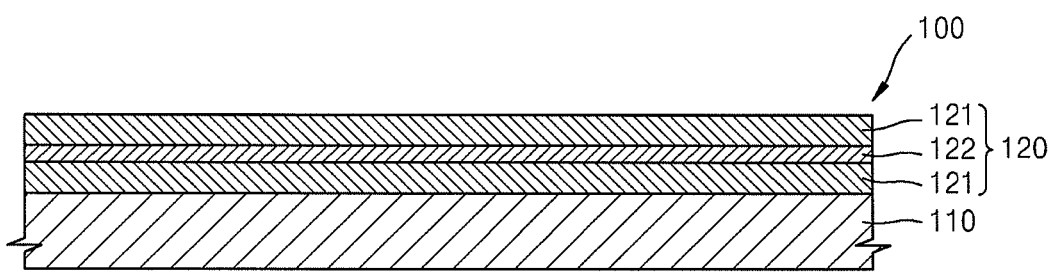
Figure 3:
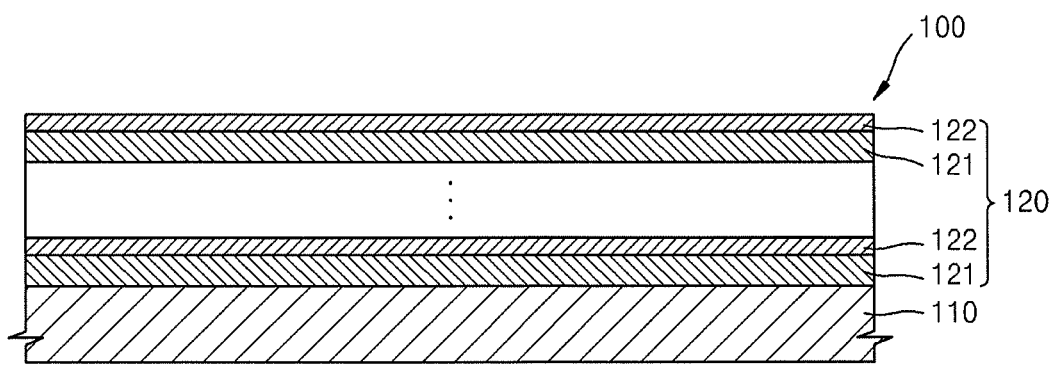

FIGS. 1 through 3 are cross-sectional views of one embodiment of a substrate 100 for a display apparatus. Referring to FIGS. 1 through 3, the substrate 100 includes a a barrier layer 120 formed on a base substrate 110.

The base substrate 110 may be formed, for example, as a plastic substrate having excellent heat resistance and durability. In one embodiment, the base substrate 110 may be formed to include a polymer. For example, the base substrate 110 may include one selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), poly(arylene ether sulfone), or combinations thereof.

Figure 5:
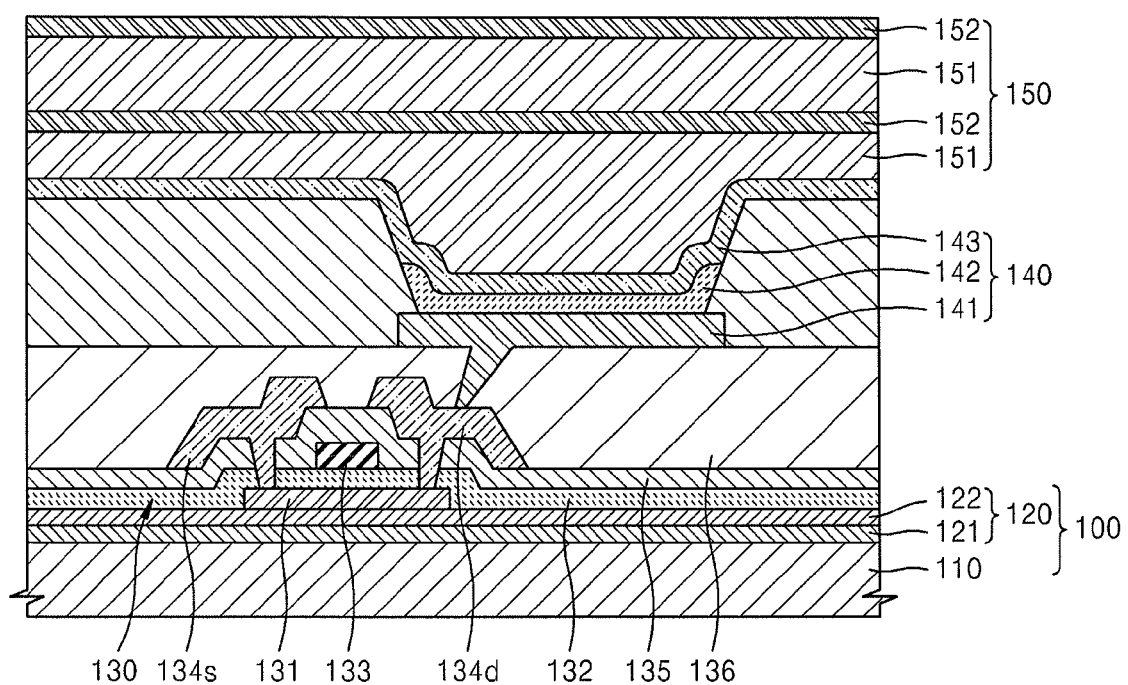
FIG. 5 illustrates an embodiment of a display apparatus using the substrate of FIG. 1.

When the base substrate 110 is formed to include polyimide, the substrate may demonstrate excellent mechanical strength and superior heat resistance due to a high maximum processible temperature of about 450° C. As a result, using this material may allow the base substrate 110 to stably perform its function without sagging due to elements and layers thereon. In one embodiment, a polyimide substrate may be formed using a heating process, for example, during a time when a thin film transistor 130 and a display device 140 (e.g., as shown in FIG. 5) are formed. Also, forming base substrate 110 to include polyimide and/or other plastic materials may allow the base substrate to have flexibility.

When the base substrate 110 is a plastic substrate, a penetration ratio of moisture and oxygen may be relatively high compared to glass or metal substrates. In order to prevent the penetration of moisture into the base substrate 110, the barrier layer 120 may be formed on the base substrate 110.

The barrier layer 120 may be formed directly or indirectly on all or a predetermined portion of the base substrate 110. The barrier layer 120 may be formed to include, for example, a silicon oxide layer containing only silicon (Si) and oxygen (O). In other embodiments, the barrier layer 120 may be a silicon oxide layer including a plurality of layers having different amounts of silicon along a thickness direction of the barrier layer 120, e.g., the amount of silicon of a first part may be different the amount of silicon in a second part along a thickness direction of the silicon oxide layer. For example, the barrier layer 120 may have a structure in which a first barrier layer 121 corresponding to the first part has a relatively low amount of silicon and a second barrier layer 122 corresponding to the second part has a relatively high amount of silicon (Si-rich). In one embodiment, a plurality of each of these layers may be alternately stacked on base substrate 110.

The barrier layer 120 may be prepared using, for example, plasma-enhanced chemical vapor deposition (PECVD) or atomic layer deposition (ALD). After the base substrate 110 including plastic (e.g., polyimide) is formed on a carrier substrate, the barrier layer 120 may be formed thereon by using PECVD or ALD. In the barrier layer 120, the amount of silicon may continuously or discontinuously vary along a thickness direction due to conditions such as a formation time, a source injection time and amount, and a resting phase.

As illustrated in FIG. 1, the barrier layer 120 may include the first barrier layer 121 and the second barrier layer 122. In one embodiment, the first barrier layer 121 includes $Si_aO_b$ and the second barrier layer 122 includes $Si_cO_d$ (a/b≠c/d). Alternatively, as illustrated in FIGS. 2 and 3, the barrier layer 120 may have a structure in which the first and second barrier layers 121 and 122 are alternately stacked.

In FIGS. 1 to 3, the first barrier layer 121 is formed directly on the base substrate 110 and the second barrier layer 122 is formed on the first barrier layer 121. According to other embodiments, the second barrier layer 122 may be formed directly on the base substrate 110 and the first barrier layer 121 may be formed on the second barrier layer 122. In another embodiment, one or more intervening layers may be formed between barrier layer 120 and base substrate 110.

Also, in one embodiment, the first barrier layer 121 may include $SiO_2$ that is stoichiometric silicon oxide, and the second barrier layer 122 may include Si-rich silicon oxide ($Si_cO_d$) having a higher amount of silicon than the first barrier layer 121. A composition ratio (c/d) of silicon and oxygen of the second barrier layer 122 may be, for example, greater than 0.5 and equal to or less than 1.0. In other embodiments, the composition ratio (c/d) may be in a different range.

Because silicon dangling bonds of the second barrier layer 122 (e.g., an Si-rich silicon oxide layer) are coupled to moisture penetrating through the base substrate 110, the second barrier layer 122 may suppress diffusion of moisture and thus may prevent deterioration of an element formed on the barrier layer 120. The silicon dangling bonds of the second barrier layer 122 may also be coupled to hydrogen atoms. Because hydrogen atoms may deteriorate an element formed on barrier layer 120 (e.g., an active layer 131 of thin film transistor 130 in FIG. 5), the barrier layer 120 may include the first barrier layer 121 in addition to the second barrier layer 122.

The first barrier layer 121 may be formed to have a thickness greater than that of the second barrier layer 122, may constantly maintain a stress balance, and/or may block hydrogen atoms that possibly exist in the barrier layer 120. For example, the thickness of the first barrier layer 121 may be 1,000 Å to 10,000 Å, and the thickness of the second barrier layer 122 may be 200 Å to 5,000 Å. In other embodiments, the first and second barrier layers 121 and 122 may have different thicknesses.

By including the first barrier layer 121 formed of $SiO_2$ and the second barrier layer 122 having a higher amount of silicon than the first barrier layer 121, the barrier layer 120 may reduce or minimize bias temperature stress (BTS) defects and may also reduce or minimize low-grayscale dark spots. (The BTS test may include, for example, a test for measuring a shift of a threshold voltage by applying electrical stress and thermal stress to a display apparatus).

Figure 4A:
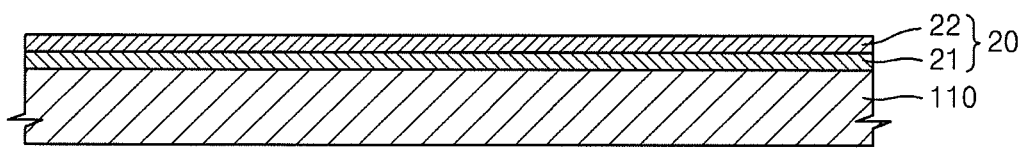
FIGS. 4A and 4B illustrate comparative examples of display apparatus substrates.
Figure 4B:
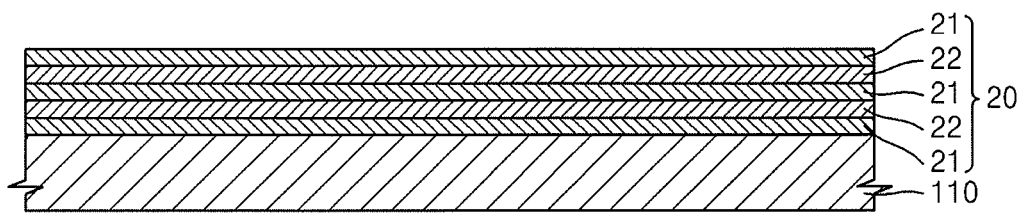

FIGS. 4A and 4B are cross-sectional views of comparative substrates for a display apparatus. FIG. 4A shows that a barrier layer 20 on the base substrate 110 includes a silicon oxide layer 21 and a silicon nitride layer 22. FIG. 4B shows that a barrier layer 20 on the base substrate 110 includes a plurality alternately stacked silicon oxide and nitride layers 21 and 22.

A BTS test for the substrates in FIGS. 4A and 4B may be performed and the number of low-grayscale dark spots may be checked. In such a test, electrical stress may be applied by applying a predetermined voltage (e.g., about 20 V) to a gate electrode, e.g., as shown in FIG. 5. Thermal stress may be applied by exposing a display apparatus to a temperature of about 100° C. The stress-applied state may be held for a certain time (e.g., about 10 minutes), and then a shift of a threshold voltage may be measured. If the shift of the threshold voltage is greater than a predetermined amount (e.g., about ±0.2 V), then the presence of a defect may be detected.

When the barrier layer 20 in FIG. 4A is used, a BTS failure rate may be about 10 to 40%, and the number of low-grayscale dark spots may be 1/cell. When the barrier layer 20 in FIG. 4B is used, the BTS failure rate may be about 0%, but the number of low-grayscale dark spots is a plural number/cell. Here, a cell may refer to one sub-pixel of an organic light-emitting device.

When barrier layer 20 having silicon oxide and silicon nitride layers is used, the BTS failure rate may be high if the number of low-grayscale dark spots may be small. Conversely, if the BTS failure rate is low, the number of low-grayscale dark spots may be large. Also, if the number of layers is increased in the barrier layer 20 including the silicon oxide and nitride layers 21 and 22, the BTS failure rate may be reduced but the number of low-grayscale dark spots may increased. If the number of layers is reduced, the number of low-grayscale dark spots is reduced, but the BTS failure rate may increase. That is, if the barrier layer 20, including the silicon oxide and nitride layers 21 and 22, is used, a substrate for a high-quality display apparatus having a low BTS failure rate and a small number of low-grayscale dark spots may not be easily provided.

When the barrier layer 120 including $SiO_2$ and Si-rich $SiO_x$ as illustrated in FIG. 1 is used, a BTS failure rate is equal to or less than about 2% and the number of low-grayscale dark spots is 2/cell. Thus, the barrier layer 120 according to an embodiment may have a low BTS failure rate and a small number of low-grayscale dark spots.

FIG. 5 is a cross-sectional view of a display apparatus using any of the aforementioned embodiments of substrate 100. The display apparatus may be an organic light-emitting display apparatus or another type of display apparatus.

In the illustrative example shown in FIG. 5, the display apparatus includes substrate 100 as described in relation to FIGS. 1 through 3, thin film transistor 130 formed on the substrate 100, and display device 140. The barrier layer 120 of the substrate 100 may protect the thin film transistor 130 and the display device 140 from moisture that may penetrate through base substrate 110.

The thin film transistor 130 may be formed on the barrier layer 120, and may include active layer 131, a gate electrode 133, a source electrode 134s, and a drain electrode 134d. A first interlayer insulating layer 132 may be disposed between the active layer 131 and the gate electrode 133 as a gate insulating layer for insulating them from each other. The active layer 131 may include a channel region formed in a central region, and a source region and a drain region formed at respective sides of the channel region. The source and drain regions may be formed, for example, by an impurity doping process, which, for example, may use gate electrode 133 as a self-aligned mask. The active layer 131 may include amorphous silicon or crystalline silicon, or an oxide semiconductor.

The source and drain electrodes 134s and 134d may be formed on the gate electrode 133 with a second interlayer insulating layer 135 therebetween, and are electrically connected to respective ones of the source and drain regions of the active layer 131. A third interlayer insulating layer 136 may be formed on the source and drain electrodes 134s and 134d. Although the thin film transistor 130 is shown as a top-gate-type transistor in FIG. 5, transistor 130 may be a bottom-gate-type thin film transistor in other embodiments.

The display device 140 may be formed on the barrier layer 120. The display device 140 may include a pixel electrode 141 electrically connected to one of the source or drain electrodes 134s and 134d of the thin film transistor 130, a counter electrode 143 disposed to face the pixel electrode 141, and an intermediate layer 142 disposed therebetween and including an organic emission layer.

The organic emission layer may include a low-molecular or high-molecular organic material. If the organic emission layer includes a low-molecular organic material, the intermediate layer 142 may include a hole transport layer and a hole injection layer formed in a direction toward the pixel electrode 141, and an electron transport layer and an electron injection layer formed in a direction toward the counter electrode 143, with respect to the low-molecular organic material.

In addition, various layers additional layers may be optionally formed. If the organic emission layer includes a high-molecular organic material, the intermediate layer 142 may include only a hole transport layer in a direction toward the pixel electrode 141. In the above-described organic emission layer, sub-pixels for emitting red light, green light, and blue light may form one unit pixel. Alternatively, sub-pixels for emitting red light, green light, blue light, and white light (or a different combination of light) may form one unit pixel.

The pixel electrode 141 may be formed as a reflective electrode using metal having a light reflecting property, and the counter electrode 143 may have a light transmitting property. Thus, the display apparatus may be formed as a top-emission-type apparatus. According to another embodiment, the pixel electrode 141 may have a light transmitting property and the counter electrode 143 may be formed as a reflective electrode by using metal having a light reflecting property. Thus, the display apparatus may be formed as a bottom-emission-type apparatus.

A thin encapsulation layer 150 may be formed on the counter electrode 143. In one embodiment, the thin encapsulation layer 150 may have a structure in which a relatively thick organic layer 151 and a relatively thin inorganic layer 152 are alternately stacked on one another. The organic layer 151 may include, for example, a polymer-based material. The polymer-based material may include an acryl-based resin, an epoxy-based resin, polyimide, polyethylene, or the like. The inorganic layer 152 may be formed of metal oxide, metal nitride, metal carbide, or a compound thereof. For example, the inorganic layer 152 may include an inorganic material such as $AlO_x$, $TiO_2$, $ZrO$, $SiO_x$, $AlON$, $AlN$, $SiN_x$, $SiO_xN_y$, $InO_x$, and/or $Y_bO_x$. The organic layer 151 may reduce internal stress of the inorganic layer 152 or may offset defects of and planarize the inorganic layer 152.

Additionally, a switching thin film transistor that is electrically connected to the capacitor may be formed on the barrier layer 120. Even after the switching thin film transistor is turned off, the capacitor may charge a driving signal applied to the thin film transistor 130.

Among the various types of display apparatuses, an organic emission layer used in an organic light-emitting display apparatus is very vulnerable to moisture. According to an embodiment, since the barrier layer 120 is formed on the base substrate 110, the organic emission layer may be protected from moisture. Moisture protection may be especially evident in the illustrative case of when the barrier layer includes $SiO_2$ and Si-rich $SiO_x$. In addition, as previously described above in relation to FIGS. 4A and 4B, a BTS failure rate and the number of low-grayscale dark spots may be reduced or minimized, and thus a high-quality display apparatus may be provided.

Although the substrate 100 is used as a lower substrate of an organic light-emitting display apparatus, the substrate 100 may be used as an encapsulation member in another embodiment. For example, the substrate 100 may be used as an encapsulation member for protecting a top surface of the display apparatus illustrated in FIG. 5.

While an embodiment corresponding to an organic light-emitting display apparatus is discussed above, in other embodiments the display apparatus may be a liquid crystal display apparatus or another type of display apparatus which includes the base substrate 110 and the barrier layer 120.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate for a display apparatus, the substrate comprising:
    a base substrate; and
    a barrier layer disposed on the base substrate, wherein the barrier layer includes a silicon oxide layer and the silicon oxide layer includes a first part and a second part along a thickness direction of the barrier layer, wherein an amount of silicon in the first part is different from an amount of silicon in the second part, wherein:
    the barrier layer includes a first barrier layer which includes the first part and a second barrier layer which includes the second part that contains a greater amount of silicon than the first barrier layer,
    the second barrier layer is distal to the substrate than the first barrier layer such that the first barrier layer is between the substrate and the second barrier layer, the first barrier layer being a barrier layer closest to the base substrate, and wherein a plurality of first and second barrier layers are alternately stacked on one another.

2. The substrate as claimed in claim 1, wherein:
    a thickness of the second barrier layer of the silicon oxide layer is less than a thickness of the first barrier layer.

3. The substrate as claimed in claim 1, wherein the first barrier layer contains $SiO_2$.

4. The substrate as claimed in claim 3, wherein a composition ratio (c/d) of silicon and oxygen of the second barrier layer ($Si_cO_d$) is greater than about 0.5 and equal to or less than about 1.0.

5. The substrate as claimed in claim 1, wherein the base substrate includes a plastic material.

6. The substrate as claimed in claim 5, wherein the barrier layer is formed directly on the base substrate.

7. The substrate as claimed in claim 1, wherein the base substrate is a flexible.

8. A display apparatus, comprising:
    a plastic substrate;
    a barrier layer on the plastic substrate;
    a thin film transistor on the plastic substrate; and
    a display device on the plastic substrate and electrically connected to the thin film transistor, wherein the display device includes an organic emission layer and wherein the barrier layer is disposed between the plastic substrate and the thin film transistor, the barrier layer including a silicon oxide layer having a first part and a second part along a thickness direction, the first and second parts having different amounts of silicon, wherein:
    the second part contains a greater amount of silicon than the first part,
    the first part is a part of the barrier layer closest to the plastic substrate, wherein the barrier layer comprises a first barrier layer including the first part and a second barrier layer including the second part, and a plurality of first and second barrier layers are alternately stacked on one another.

9. The display apparatus as claimed in claim 8, wherein the barrier layer comprises a layer including the first part having a first amount of silicon and a layer including the second part having a second amount of silicon greater than the first amount of silicon.

10. The display apparatus as claimed in claim 9, wherein a composition ratio (c/d) of silicon and oxygen of the layer having the second amount of silicon is greater than about 0.5 and equal to or less than about 1.0.

11. The display apparatus as claimed in claim 9, wherein a plurality of layers having the first amount of silicon and the second amount of silicon are alternately formed along the thickness direction.

12. The display apparatus as claimed in claim 9, wherein the plastic substrate includes polyimide.

13. The display apparatus as claimed in claim 8, wherein the first part includes $Si_aO_b$ and the second part includes $Si_cO_d$, and wherein $a/b \neq c/d$.

14. The display apparatus as claimed in claim 13, wherein a thickness of the first barrier layer is different from a thickness of the second barrier layer.

15. The display apparatus as claimed in claim 14, wherein the thickness of the first barrier layer is greater than the thickness of the second barrier layer.

16. The display apparatus as claimed in claim 13, wherein a thickness of the first barrier layer is about 1,000 Å to about 10,000 Å.

17. The display apparatus as claimed in claim 13, wherein a thickness of the second barrier layer is about 200 Å to about 5,000 Å.

18. The display apparatus as claimed in claim 8, wherein the display device comprises:
    a pixel electrode;
    an intermediate layer on the pixel electrode and including an organic emission layer; and
    a counter electrode facing the pixel electrode.

* * * * *